(12) United States Patent
Pan et al.

(10) Patent No.: US 12,506,098 B2
(45) Date of Patent: Dec. 23, 2025

(54) METHOD FOR CHIP PACKAGING WITH HIGH-DENSITY CONNECTION LAYER, AND CHIP PACKAGING STRUCTURE

(71) Applicant: Jiangsu Silicon Integrity Semiconductor Technology Co., Ltd., Nanjing (CN)

(72) Inventors: Steven Pan, Nanjing (CN); Alex Xie, Nanjing (CN); Peter Chen, Nanjing (CN); Baker Ma, Nanjing (CN); Melvin Mei, Nanjing (CN)

(73) Assignee: Jiangsu Silicon Integrity Semiconductor Technology Co., Ltd., Pukou Nanjing (CN)

( * ) Notice: Subject to any disclaimer, the term of this patent is extended or adjusted under 35 U.S.C. 154(b) by 0 days.

(21) Appl. No.: 18/997,405

(22) PCT Filed: Sep. 20, 2023

(86) PCT No.: PCT/CN2023/119916
§ 371 (c)(1),
(2) Date: Jan. 21, 2025

(87) PCT Pub. No.: WO2024/067275
PCT Pub. Date: Apr. 4, 2024

(65) Prior Publication Data
US 2025/0259955 A1   Aug. 14, 2025

(30) Foreign Application Priority Data

Sep. 27, 2022 (CN) .......................... 202211179108.2

(51) Int. Cl.
*H01L 23/00* (2006.01)
*H01L 21/48* (2006.01)
(Continued)

(52) U.S. Cl.
CPC .......... *H01L 24/14* (2013.01); *H01L 21/4857* (2013.01); *H01L 21/6835* (2013.01);
(Continued)

(58) Field of Classification Search
CPC ......... H01L 24/14; H01L 24/16; H01L 24/32; H01L 24/73; H01L 21/4857;
(Continued)

(56) References Cited

U.S. PATENT DOCUMENTS 10,833,052 B2 * 11/2020 Shih .................... H01L 23/5383
2002/0108781 A1   8/2002 Mune et al.
(Continued)

FOREIGN PATENT DOCUMENTS

CN       107359142 A    11/2017
CN       111769063 A    10/2020
(Continued)

OTHER PUBLICATIONS

First Office Action, CN Application No. 202211179108.2, SIPO, Nov. 11, 2022, Beijing, CN.
(Continued)

*Primary Examiner* — Peniel M Gumedzoe
(74) *Attorney, Agent, or Firm* — Frost Brown Todd LLP; Alexander J. Johnson

(57) ABSTRACT

Disclosed are a method for chip packaging having a high-density connection layer and a chip packaging structure, the method comprising S1: preparing a high-density connection layer having multilayered metal wiring layer; S2: preparing a substrate intermediate, and attaching thereto the high-density connection layer; S3: embedding the high-density connection layer into the substrate and preparing a first type pads connected with the multilayered metal wiring layer and a second type pads connected with a wiring layer of the substrate intermediate; S4: inversely mounting the chip on
(Continued)

the substrate surface, the first type chip bumps being connected to the first type pads, and the second type chip bumps being connected to the second type pads. Part of the wiring layer inside the substrate is replaced with single-sided or double-sided high-density connection layer to reduce the number of layers and thickness of the substrate, facilitating layout and wiring and improving integration and performance.

5 Claims, 10 Drawing Sheets

(51) Int. Cl.
*H01L 21/683* (2006.01)
*H01L 23/367* (2006.01)
*H01L 23/538* (2006.01)
*H01L 25/065* (2023.01)
*H01L 25/16* (2023.01)

(52) U.S. Cl.
CPC ...... *H01L 23/5385* (2013.01); *H01L 23/5386* (2013.01); *H01L 24/16* (2013.01); *H01L 25/0655* (2013.01); *H01L 23/3677* (2013.01); *H01L 24/32* (2013.01); *H01L 24/73* (2013.01); *H01L 25/16* (2013.01); *H01L 2224/1403* (2013.01); *H01L 2224/14131* (2013.01); *H01L 2224/14135* (2013.01); *H01L 2224/16227* (2013.01); *H01L 2224/32225* (2013.01); *H01L 2224/32245* (2013.01); *H01L 2224/73204* (2013.01); *H01L 2224/73253* (2013.01); *H01L 2924/15311* (2013.01)

(58) Field of Classification Search
CPC ............. H01L 21/6835; H01L 23/5385; H01L 23/5386; H01L 23/3677; H01L 25/0655; H01L 25/16; H01L 2224/1403; H01L 2224/14131; H01L 2224/14135; H01L 2224/16227; H01L 2224/32225; H01L 2224/32245; H01L 2224/73204; H01L 2224/73253; H01L 2924/15311

See application file for complete search history.

(56) References Cited

U.S. PATENT DOCUMENTS

| | | |
|---|---|---|
| 2011/0143501 A1 | 6/2011 | Oda et al. |
| 2015/0348895 A1 | 12/2015 | Sen et al. |
| 2016/0143139 A1* | 5/2016 | Sorimachi ............... H01L 25/50 361/772 |
| 2019/0006264 A1 | 1/2019 | Vaidya et al. |
| 2020/0035603 A1 | 1/2020 | Rubin et al. |
| 2020/0243448 A1 | 7/2020 | Qian et al. |
| 2020/0303310 A1 | 9/2020 | Alur et al. |
| 2021/0035911 A1 | 2/2021 | Ganesan et al. |
| 2021/0134723 A1 | 5/2021 | May et al. |

FOREIGN PATENT DOCUMENTS

| | | |
|---|---|---|
| CN | 112086447 A | 12/2020 |
| CN | 112514062 A | 3/2021 |
| CN | 114267661 A | 4/2022 |
| CN | 217387150 U | 9/2022 |
| CN | 217444385 U | 9/2022 |
| CN | 115274475 A | 11/2022 |

OTHER PUBLICATIONS

Published Application with Int'l. Search Report, PCT/CN2023/119916, ISA/CN, SIPO, Nov. 20, 2023, Beijing, CN.
Written Opinion of the ISA, PCT/CN2023/119916, ISA/CN, SIPO, Nov. 20, 2023, Beijing, CN.

* cited by examiner

METHOD FOR CHIP PACKAGING WITH HIGH-DENSITY CONNECTION LAYER, AND CHIP PACKAGING STRUCTURE

FIELD

The present application relates generally to the field of semiconductor packaging technology, and in particular to a method for chip packaging having a high-density connection layer and a chip packaging structure.

BACKGROUND

In the prior art, flip chip packaging is a process in which a chip with bump electrodes on the working surface is facing downward and directly bonded with the package substrate so that the chip is interconnected with the package substrate through the array of bumps arranged on the chip. The package substrate is generally selected from a substrate including at least one dielectric layer and a wiring layer distributed on the dielectric layer, the wiring layers of the adjacent dielectric layers are electrically connected with each other.

In order to meet the requirements of integrated and high-density packaging, packaging structure requires more lines and pins, for which more substrate layers are required to realize layout design of circuit.

However, the more layers of the substrate, the greater the difficulty of layout and wiring and the more complex the production process, and the integration level of the package structure is greatly lowered, which is unable to meet the demand for integration and inevitably leads to an increase in cost.

Therefore, there is an urgent need for chip packaging methods that can reduce the number of substrate layers and improve circuit integration and performance.

SUMMARY

In view of the above matters, the present disclosure provides a method for chip packaging having a high-density connection layer and a chip packaging structure thereof, in which part of the wiring layer inside the substrate is replaced with a high-density connection layer, thereby reducing the number of substrate layers and thickness, lowering the difficulty of the substrate layout and wiring, and improving the integration and performance of the circuit.

According to an aspect of the present disclosure, there is provided a method for chip packaging with a high-density connection layer including the steps of:
S1: Preparing a high-density connection layer comprising multilayered metal wiring layer, a plastic sealing layer II disposed on one side of the multilayered metal wiring layer, said multilayered metal wiring layer having conductive bumps on the surface, said plastic sealing layer II having a silicon wafer therein being electrically connected to the conductive bumps on the surface of the multilayered metal wiring layer;
wherein the preparation of the high density connection layer includes:
S1-1B: Flipping chip by: preparing a silicon wafer being ground and thinned to form a ground surface and a bright surface, the silicon wafer being cut from a wafer and not containing a device: preparing a carrier wafer to which a temporary bonding layer is affixed: and inverting and pressing the bright surface of the wafer onto the temporary bonding layer:
S1-2B: Preparing a plastic sealing layer II wrapping the wafer by: conducting plastic sealing on the temporary bonding layer by injection molding to form the plastic sealing layer II inside which said wafer is wrapped;
S1-3B: Preparing multilayered metal wiring layer by: stripping the temporary bonding layer from the carrier wafers by debonding, preparing an insulating medium layer with patterned openings on the bright surface of the wafer, and forming said multilayered metal wiring layer by electroplating or sputtering process within the openings, said multilayered metal wiring layer having conductive bumps on the surface thereof and interconnections between adjacent metal wiring layers, and the metal wiring layers having 2 to 10 layers;
S1-4B: Thinning the plastic sealing layer II to a thickness at least greater than the thickness of the wafer;
S1-5B: Dicing to obtain a high-density connection layer;
S2: Preparing a substrate intermediate comprising at least one dielectric layer and a wiring layer running through the dielectric layer, and attaching a high-density connection layer to the substrate intermediate;
S3: Continuing fabrication of a substrate by preparing a surface dielectric layer on said substrate intermediate, a high density connection layer being embedded in the surface dielectric layer of the substrate, preparing a first type pads and a second type pads on said surface dielectric layer, said first type pads electrically connected at the bottom to the conductive bumps of the multilayered metal wiring layer and exposed at the top to said surface dielectric layer, said second type pads running through the surface dielectric layer and electrically connected at the bottom to the substrate intermediate's wiring layer; and
S4: Inversely mounting the chip on the surface of the substrate, said chip being provided with a first type bump and a second type bump, said first type bump being electrically connected to the first type pads, and said second type bump being electrically connected to the second type pads.

In some embodiments, after completion of step S4, the chip encapsulation is continued by filling filler between the bottom of the chip and the substrate, the surface of the chip is coated with a thermally conductive interface layer, the thermally conductive interface layer is affixed with a heat sink, the surface of said heat sink and the surface of the substrate being connected by a bonding material, and solder balls are fabricated on the wiring layer on the side of the substrate that is not encapsulated with the chip, to complete the ball-grid array encapsulation.

In some embodiments, in step S4, at least two flip chips are provided on the surface of the substrate, the first type of bumps of two adjacent chips are positioned close to each other and are both connected to the conductive bumps of the multilayered metal wiring layer, so that the two adjacent chips are connected by the high-density connection layer.

In some embodiments, the first type bumps have a diameter of 25 to 65 μm and a center spacing dimension of 40 to 100 μm between adjacent first type bumps, and the second type bumps have a diameter dimension of 60 to 150 μm and a center spacing dimension of 100 to 300 μm between adjacent second type bumps.

In some embodiments, in step S1 the high-density connection layer is a double-sided high-density connection layer, the high-density connection layer further comprises a plastic sealing layer I disposed on one side of the multilayered metal wiring layer, the plastic sealing layer is provided with a copper post running therethrough, and the two ends of the copper post are electrically connected with the conductive bumps on the lower surface of the multilayered metal wiring layer and the wiring layer of the substrate intermediate respectively.

In some embodiments, the high-density connection layer in step S1 further includes a plastic sealing layer III disposed on one side of the multilayered metal wiring layer;

The preparation of the high-density connection layer includes:

S1-1C: Preparation of plastic sealing layer III on the substrate by: preparing a substrate and use injection molding or laminating process to prepare Plastic Seal Layer III on the substrate;

S1-2C: Preparation of multilayered metal wiring layer by: preparing an insulating medium layer with patterned openings on the surfaces of the plastic sealing layer III, and forming a multilayered metal wiring layer within the openings using an electroplating or sputtering process, the multilayered metal wiring layer has conductive bumps on the surface thereof, with interconnections between adjacent metal wiring layers: and the multilayered metal wiring layer having 2 to 10 metal wiring layers;

S1-3C: Thinning the plastic sealing layer III after removing the substrate;

S1-4C: Cutting into single pieces to obtain a high-density connection layer.

According to another aspect of the present disclosure, there is provided a chip package structure having a high-density connection layer including a substrate, a high-density connection layer embedded within the substrate, and a flip chip on a surface of the substrate. The substrate has a surface dielectric layer within which the high-density connection layer is disposed. The substrate below the surface dielectric layer includes at least one dielectric layer and a line layer running through the dielectric layer. The high-density connection layer includes a multilayered metal wiring layer, a plastic sealing layer disposed on one side of the multilayered metal wiring layer, and a copper post penetrating the plastic sealing layer. Conductive bumps are provided on the top and bottom of the multilayered metal wiring layer. The ends of the copper posts are electrically connected to the electrically conductive bumps on the side of the multilayered metal wiring layer and to the wiring layer of the substrate, respectively. The chip is provided with a first type bump and a second type bump. The first type bumps are connected to the conductive bumps of the multilayered metal wiring layer via the first type pads, and the second type bumps are connected to the wiring layer of the substrate via the second type pads and are disposed through the surface dielectric layer.

In some embodiments, there are at least two flip chips on the surface of the substrate. The first type bumps of the two adjacent chips are positioned closely and connected to the conductive bumps of the multilayered metal wiring layer, so that the two adjacent chips are connected by the high-density connection layer.

According to further aspect of the present disclosure, there is provided a chip package structure having a high-density connection layer, comprising a substrate, a high-density connection layer embedded within the substrate, and a flip chip on the surface of the substrate. The substrate has a surface dielectric layer, within which the high-density connection layer is disposed. The surface dielectric layer has a second type pad, and the substrate below the surface dielectric layer includes at least one dielectric layer and a wiring layer running through the dielectric. The high-density connection layer includes multilayered metal wiring layer, and a plastic sealing layer II disposed on one side of the multilayered metal wiring layer, and a silicon wafer is disposed within the plastic sealing layer II. Conductive bumps are provided on the top and bottom of the multilayered metal wiring layer. The silicon wafer is connected to the conductive bumps on one side of the multilayered metal wiring layer, the chip is provided with a first type bumps and a second type bumps, and the conductive bumps on the other side of the multilayered metal wiring layer are electrically connected to the first type bumps via first type pads, and the second type bumps are electrically connected to the second type pads. Filler is filled between the bottom of the chip and the substrate. The surface of the chip is coated with a thermally conductive interface, and a heat sink is affixed to the thermally conductive interface layer. The heat sink is connected to the surface of the substrate by bonding material. Solder balls are made on the wiring layer at the side of the substrate where the chip is not encapsulated.

According to another aspect of the present disclosure, there is provided a chip package structure having a high-density connection layer, the chip package structure includes a substrate, a high-density connection layer embedded within the substrate, and a flip chip on the surface of the substrate. The substrate has a surface dielectric layer within which the high-density connection layer is disposed. The surface dielectric layer has second type pads. The substrate below the surface dielectric layer includes at least one dielectric layer and a wiring layer running through the dielectric layer. The high-density connection layer includes a multilayered metal wiring layer and a plastic sealing layer III located on one side of the multilayered metal wiring layer. The multilayered metal wiring layer is provided with conductive bumps and the chip is provided with a first type bump and a second type bump. The conductive bumps are electrically connected to the first type bumps via the first type pads and the second type bumps are electrically connected to the second type pads. Filler is filled between the bottom of the chip and the substrate. The surface of the chip is coated with a thermally conductive interface, and a heat sink is affixed to the thermally conductive interface layer, and the heat sink is connected to the surface of the substrate by a bonding material. Solder balls are then made on the wiring layer at the side of the substrate where the chip is not encapsulated.

According to the above solutions, a method for chip packaging with a high-density connection layer and a chip packaging structure are provided. The method includes first preparing a high-density connection layer of a desired structure, then affixing the high-density connection layer to a substrate intermediate, continuing to fabricate the substrate so that the high-density connection layer is embedded within the substrate, and then inversely mounting the chip onto the substrate to complete the packaging. Compared with the prior art, the method for chip packaging of the present disclosure utilizes a wafer-level process to interconnect the chip with the substrate, and the high-density connection layer with multilayered metal wiring layer is embedded in the substrate, which can replace part of the wiring layer of in the substrate, thus reducing the number of substrate layers. The high-density connection layer can be pre-fabricated using micron-scale lithography, which makes the process route relatively simple and easy to implement, thereby reducing the cost. The specific structure of the high-density connection layer can be diversified, which increases the design flexibility and reduces the difficulty in substrate layout and wiring. The substrate combined with the high-density connection layer can reduce the thickness of the substrate, so that the devices can be arranged in a more compact manner, thereby improving the integration and performance of the circuit. The high-density connection layer inside the chip package structure prepared according to the present disclosure may be a single-sided high-density connection layer or a double-sided high-density connection layer. The double-sided high-density connection layer increases the interconnection between the single-sided high-density connection layer and the substrate compared to the single-sided high-density connection layer, and the double-sided high-density connection layer has a higher connection efficiency, which reduces the difficulty of the alignment of the chip package structure.

DETAILED DESCRIPTION

In order to make the purpose, technical solutions and advantages of the embodiments of the present disclosure clearer, the technical solutions in the embodiments of the present disclosure will be described below in conjunction with the accompanying drawings in the embodiments of the present disclosure. Obviously, the embodiment is a part of the present disclosure and not all the embodiments. The components of the embodiments illustrated in the accompanying drawings can be arranged and designed in a variety of different configurations.

Accordingly, the following detailed description of the embodiments provided in the accompanying drawings is not intended to limit the scope of the present disclosure for which protection is claimed, but rather represents only certain embodiments of the present disclosure. Based on the embodiments in the present disclosure, all other embodiments available to a person of ordinary skill in the art without inventive effort fall within the scope of the claimed protection of this application.

First Embodiment

Figure 4:
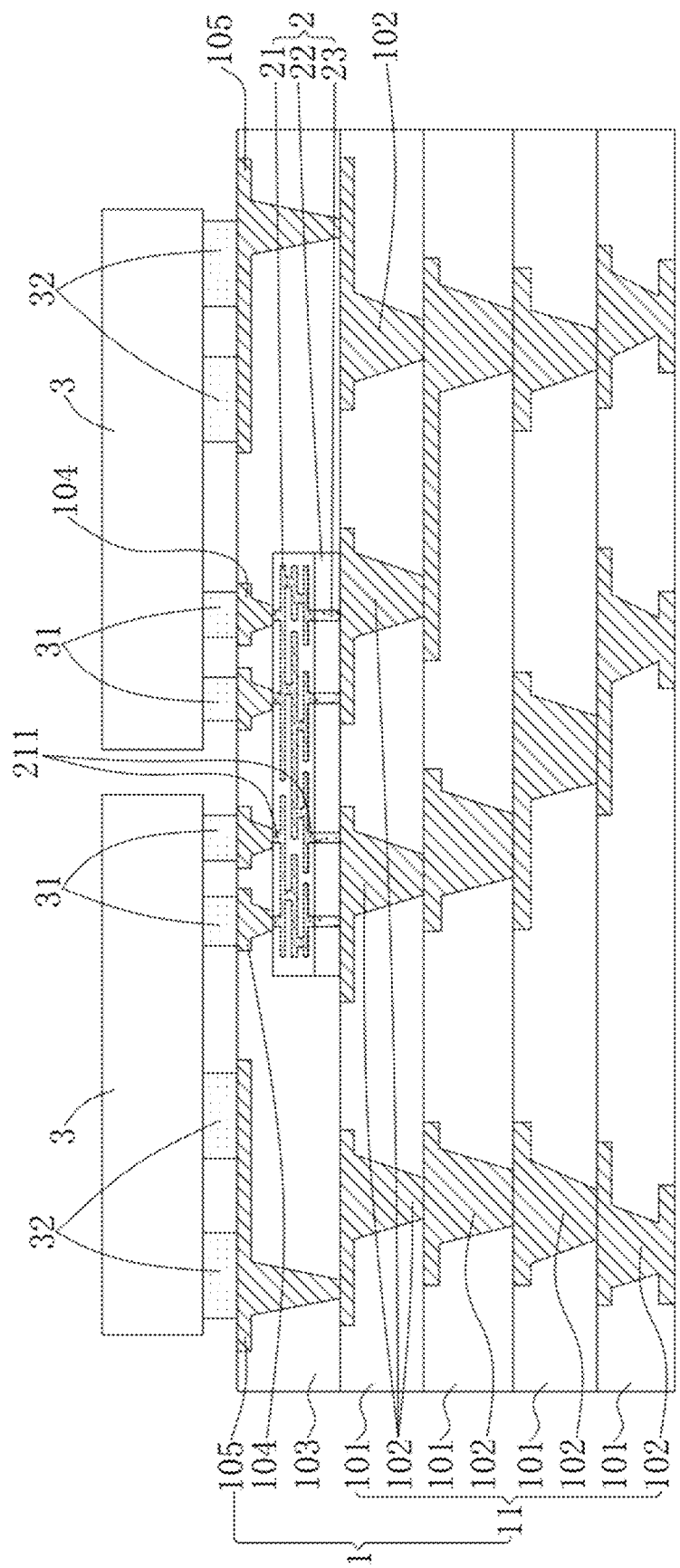
FIG. 4 is a structural diagram of a chip package of according to the first embodiment of the present disclosure.
Figure 5:
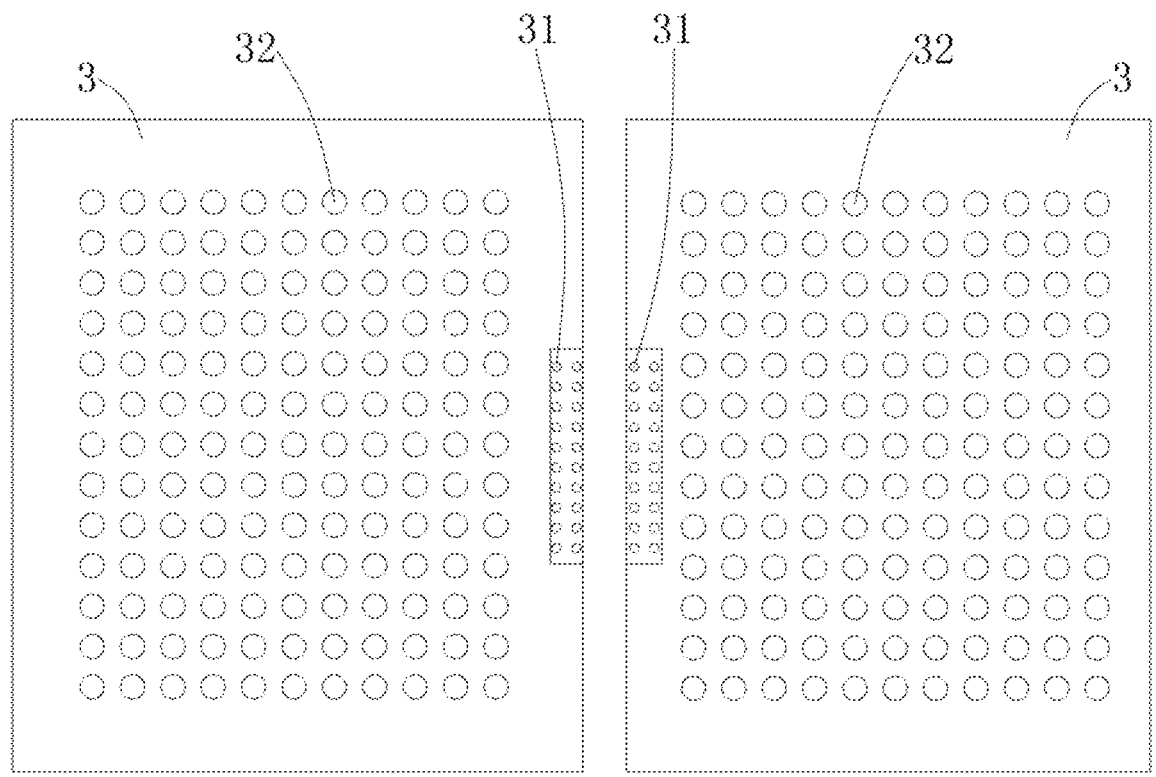
FIG. 5 is a schematic diagram of the distribution of the first type bumps and the second type bumps on the chip of the first embodiment of the present disclosure.

As shown in FIG. 4, a method for chip packaging with a high-density connection layer provided in embodiments of the present disclosure produces a chip packaging structure including a substrate 1, a high-density connection layer 2 embedded in the substrate 1, and at least two flip chips 3 on the surface of the substrate 1. Each chip 3 has first type bumps 31 and second type bumps 32. The substrate 1 has a surface layer 103 in which the high-density connection layer 2 is located. The substrate underneath the surface dielectric layer 103 includes at least one dielectric layer 101 and a wiring layer 102 running through the dielectric layer 101. The high-density connection layer 2 is a double-sided high-density connection layer, i.e., both the top and bottom of the high-density connection layer are capable of electrically connecting to the other devices. The high-density connection layer 2 includes multilayered metal wiring layer 21 and a plastic sealing layer 22 located on one side of the multilayered metal wiring layer 21. The plastic sealing layer 22 has a copper post 23 running through it, which is electrically connected to the electrically conductive bumps 211 located on the upper and lower parts of the multilayered metal wiring layer 21. The high-density connection layer 2 is embedded in the substrate 1. The copper post 23 is electrically connected to the wiring layer 102 of the substrate 1. The conductive bumps 211 on the other side of the multilayered metal wiring layer 21 are electrically connected to the first type bumps 31 of the chip 3 via the first type pads 104. The second type bump 32 of the chip 3 is electrically connected to the second type pad 105 of the substrate 1. The second type pad 105 is provided through the surface dielectric layer 103. The first type bumps 31 of two adjacent chips 3 mounted upside down on the surface of the substrate 1 are positioned close to each other, e.g., first type bump 31 on the left is on the right side of the lower surface of the chip 3, and first type bump 31 on the right is on the left side of the lower surface of the chip 3, which facilitates the connection of two adjacent chips 3 via the same high-density connection layer 2.

Figure 1:
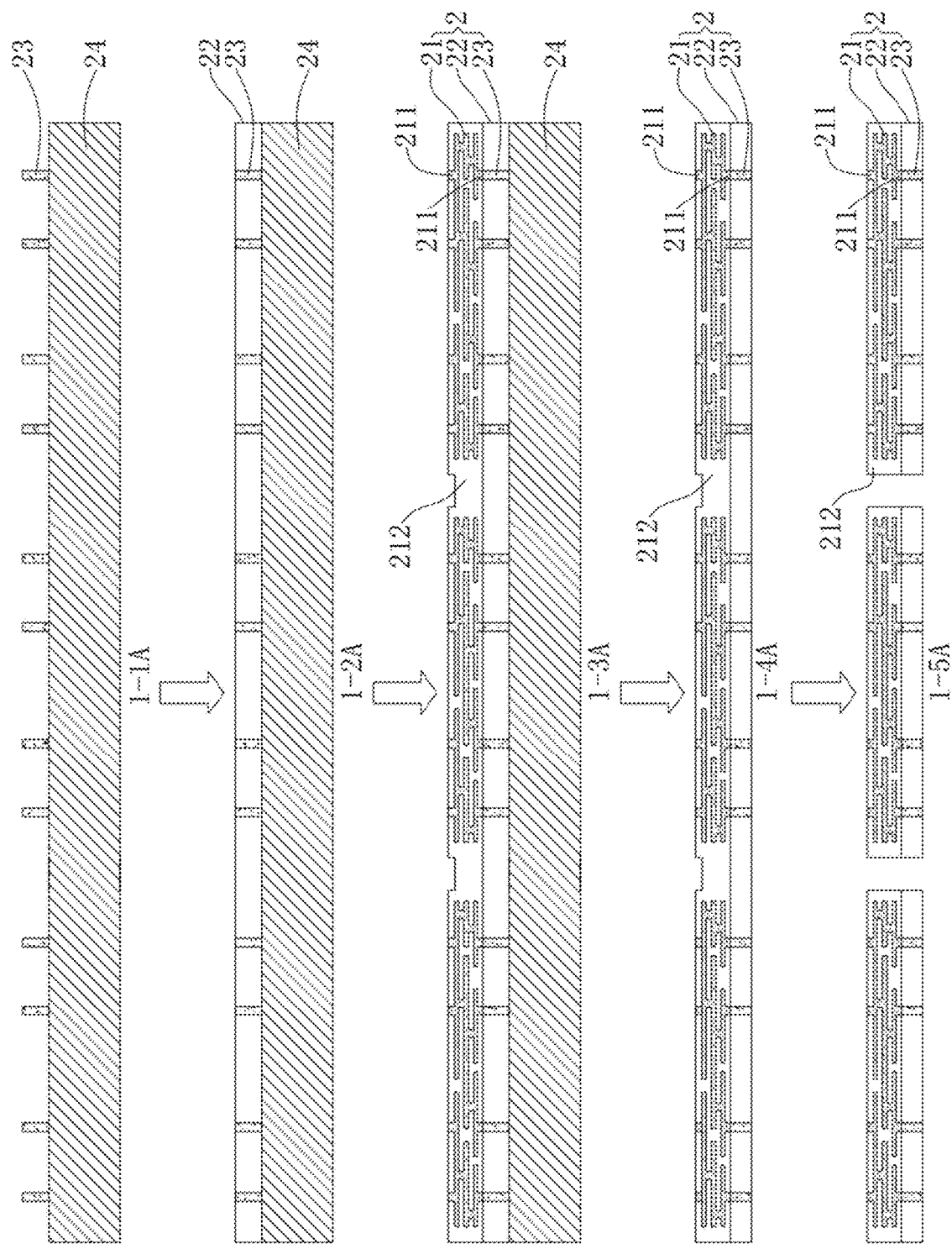
FIG. 1 is a schematic structure diagram showing the preparation process of the high-density connection layer of a first embodiment of the present disclosure.

The method for chip packaging used for producing the above chip package structure includes the following steps:

S1: Preparing high-density connection layer 2, as shown in FIG. 1.

S1-1A: Preparation of copper posts 23 on substrate 24. As shown in 1-1A, a wafer-scale substrate 24 is prepared, and a photoresist layer with patterned openings on substrate 24 is prepared by a sequential process of gluing, exposure, and development. A copper post 23 is prepared inside the openings by electroplating or sputtering and then the photoresist layer is removed. The substrate 24 is made of silicon, ceramic or glass and serves as a support. The copper posts 23 are prepared with a height of 100 to 200 μm, and serve as a conductive structure to be subsequently connected to the wiring layer inside the substrate 1.

S1-2A: Preparation of a plastic sealing layer I 22 for wrapping the copper post 23. As shown in 1-2A, the substrate 24 formed in step S1-1A is plastic sealed by injection molding to form the plastic sealing layer 122 wrapping the copper post 23. The plastic sealing layer I 22 wrapping the copper post 23 can also be formed on the substrate 24 by ABF lamination, and the end surface of the copper post 23 is exposed. If the plastic sealing layer I 22 is higher than the copper post 23 after the plastic sealing, the surface of the plastic sealing layer I 22 is grinded to expose the end surface of the copper post 23.

S1-3A: Preparation of multilayered metal wiring layer 21 on the surface of the plastic sealing layer one 22. As shown in 1-3A, an insulating medium layer 212 with patterned openings is prepared on the surface of the plastic sealing layer one 22, the material of which is selected from one of PI, PBO, and BCB. Multilayered metal wiring layer 21 is formed within the openings using an electroplating or sputtering process, with interconnections between adjacent metal wiring layers. The upper and lower surfaces of the multilayered metal wiring layer 21 have conductive bumps 211. The multilayered metal wiring layer 21 is interconnected to the copper post 23 via the conductive bumps 211 on one side. The conductive bumps 211 on the other side of the multilayered metal wiring layer 21 are used for subsequent connection to the pads or wiring layers of the substrate 1. The multilayered metal wiring layer 21 has 2 to 10 metal wiring layers and can be made of copper, aluminum, or other metals as the conductive material.

S1-4A: Removal of the substrate 24. As shown in 1-4A, the substrate 24 is removed and the plastic sealing layer I 22 is thinned by grinding to expose the copper post 23 on the side away from the multilayered metal wiring layer 21.

S1-5A: The structure formed in step S1-4A is cut into single pieces to obtain a double-sided high-density connection layer 2 (shown by 1-5A). The double-sided high-density connection layer 2 exposes conductive bumps 211 on one side and copper posts 23 on the other side for subsequent interconnection with the substrate 1 or chip 3.

Figure 2:
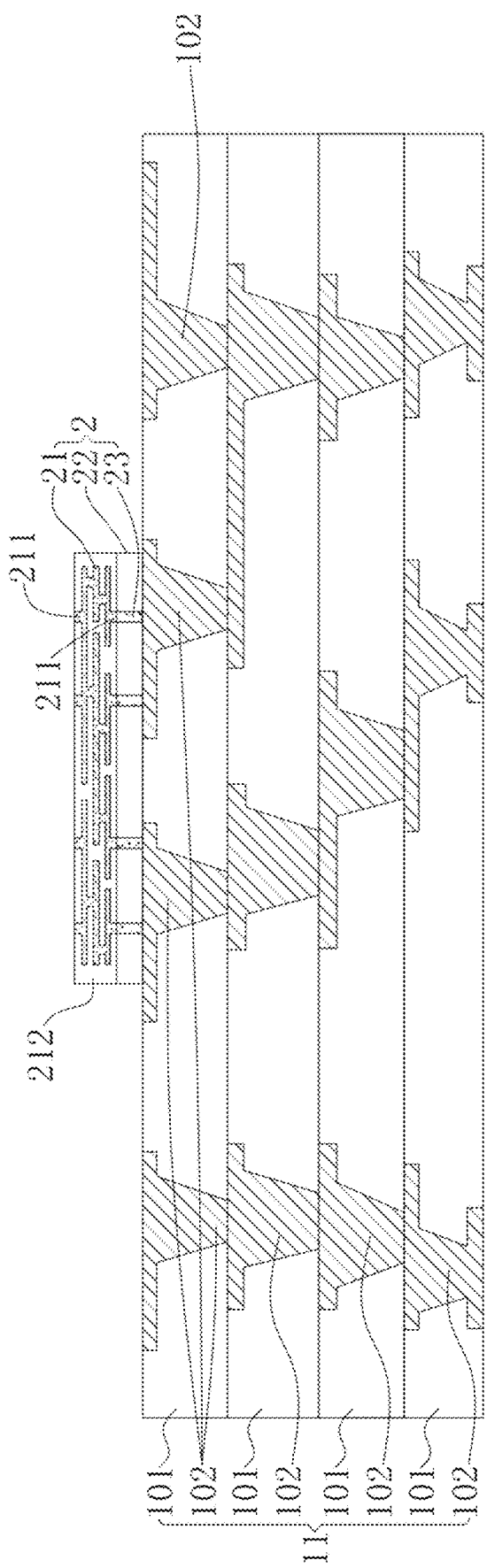
FIG. 2 is a schematic structural diagram showing a high-density connection layer affixed to a substrate intermediate according to the first embodiment of the present disclosure.

S2: Preparing the substrate intermediate 11 which comprises at least one dielectric layer 101 and a wiring layer 102 running through the dielectric layer 101 as shown in FIG. 2. The high-density connection layer 2 made in step S1 is mounted on the substrate intermediate 11 so that the copper post 23 is connected to the wiring layer 102 of the substrate intermediate 11.

Figure 3:
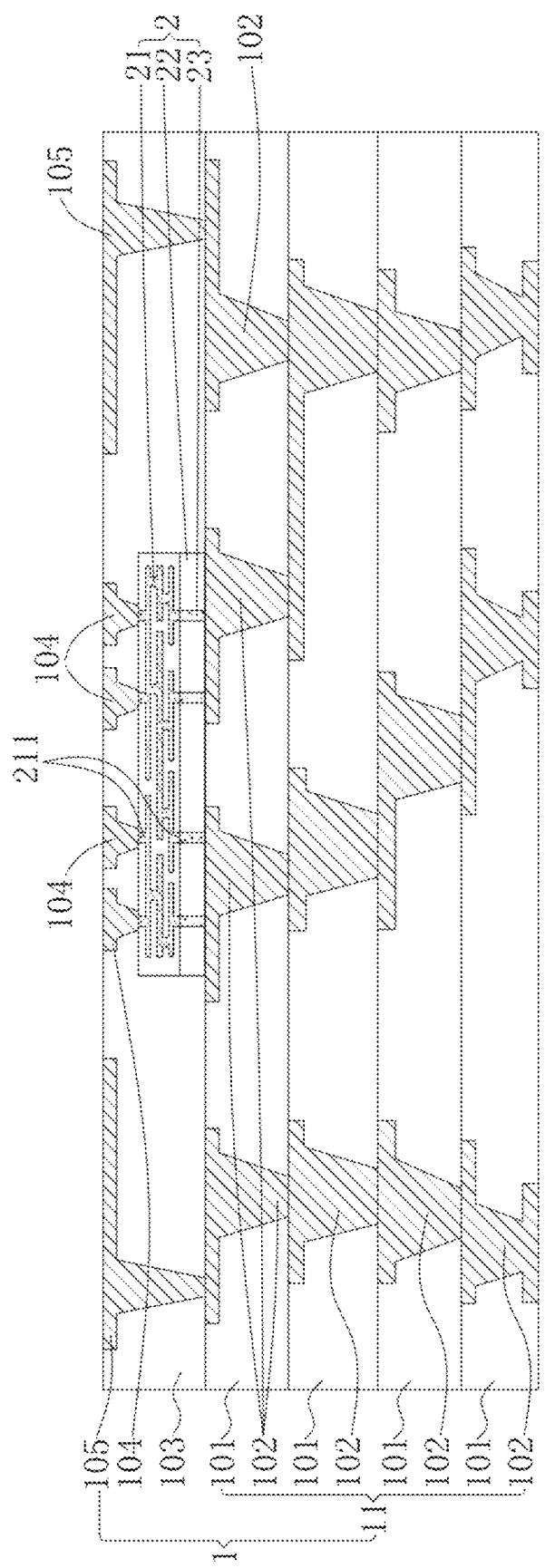
FIG. 3 is a schematic diagram of the structure of the high-density connection layer after being embedded in a substrate according to the first embodiment of the present disclosure.

S3: As shown in FIG. 3, continue to fabricate the substrate 1. A surface dielectric layer 103 is prepared on the substrate intermediate 11 so that the high-density connection layer 2 is embedded in the surface dielectric layer 103 of the substrate 1. A first type pad 104 and a second type pad 105 are prepared on the surface dielectric layer 103. The bottom of the first type pad 104 is electrically connected to the conductive bumps 211 of the multilayered metal wiring layer 21, the top of which is exposed to the surface dielectric layer 103. The second type pad 105 extends through the surface dielectric layer 103 and the bottom of which is electrically connected to the wiring layer 102 of the substrate intermediate 11.

S4: As shown in FIG. 4, at least two chips 3 are mounted upside down on the surface of the substrate 1. Each chip 3 is provided with two types of bumps, namely a first type bump 31 and a second type bump 32. The first type bump 31 of both chips 3 are connected to the conductive bumps 211 of the multilayered metal wiring layer 21 through the first type pad 104, so that the adjacent chips 3 are connected with each other through the high-density connection layer 2. The second type bump 32 of the chip 3 is electrically connected to the second type pad 105. The first type bump 31 has a diameter dimension of 25~65 μm, and the spacing dimension between the centers of two adjacent first type bumps 31 is 40~100 μm. The second type bump 32 has a diameter dimension of 60~150 μm, and the spacing dimension between the centers of two adjacent second type bumps 32 is 100~300 μm.

The high-density connection layer 2 in the present embodiment is a double-sided high-density connection layer 2, the interconnection between and the substrate 1 is increased compared to the single-sided high-density connection layer 2, the connection efficiency is higher, and the difficulty of the alignment of the chip package structure is reduced.

Second Embodiment

Figure 7:
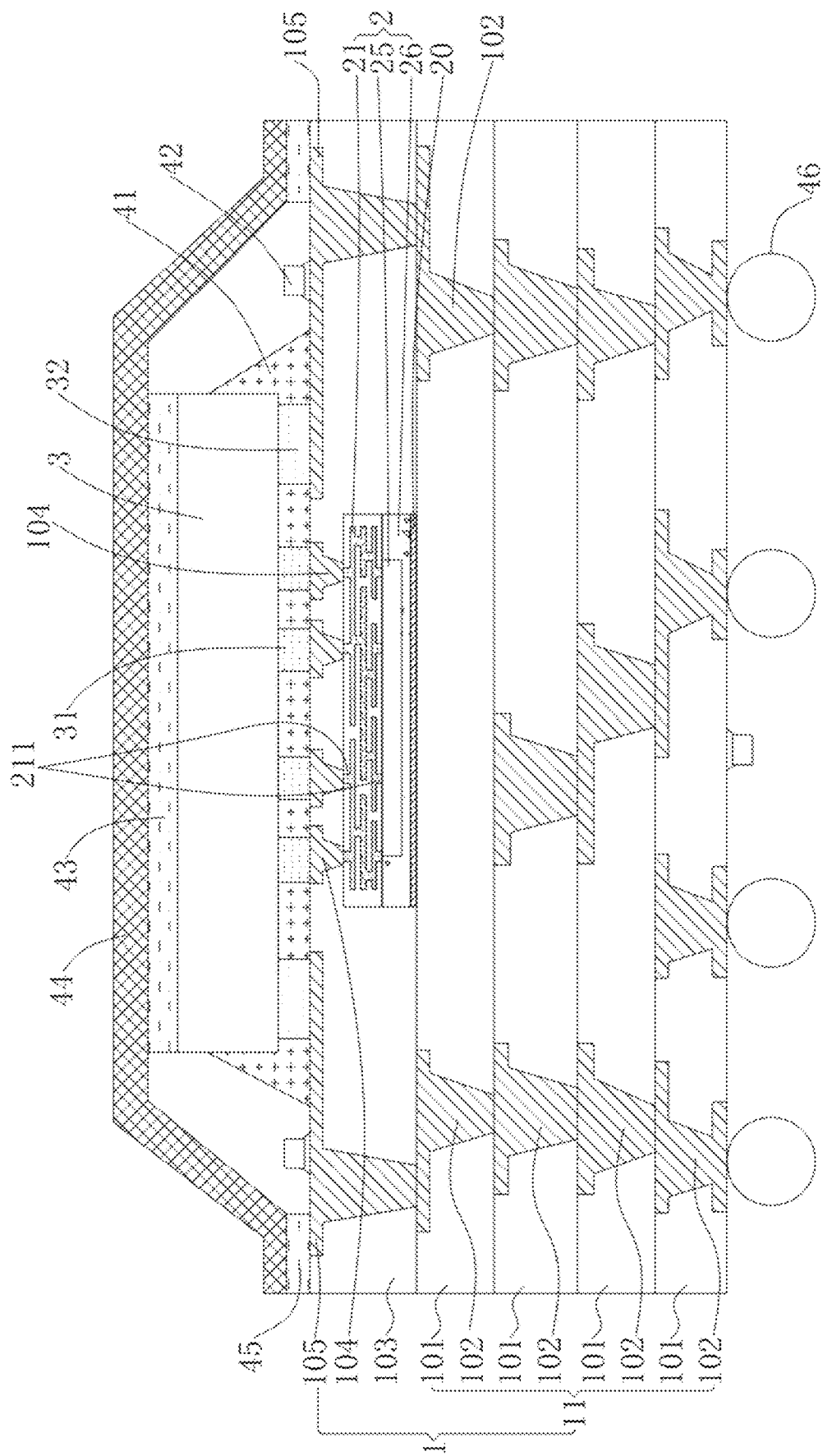
FIG. 7 is a structural diagram of a chip package of a second embodiment of the present disclosure.

FIG. 7 shows a chip package structure manufactured by a method for chip packaging with a high-density connection layer provided by embodiments of the present disclosure. The chip package structure includes a substrate 1, a high-density connection layer 2 embedded in the substrate 1, and a flip chip 3 on the surface of the substrate 1, in a BGA package (Ball Grid Array Package). The chip 3 has a first type bump 31 and a second type bump 32. The substrate 1 has a surface dielectric layer 103, and the high-density connection layer 2 is disposed within the surface dielectric layer 103. The substrate below the surface dielectric layer 103 includes at least one dielectric layer 101, and a wiring layer 102 running through the dielectric layer 101. The high-density connection layer 2 is a single-sided high-density connection layer 2, i.e., with only one side being electrically connected to other devices. The high-density connection layer 2 includes multilayered metal wiring layer 21 and a plastic sealing layer 26 located on one side of the multilayered metal wiring layer 21, and a silicon wafer 25 is provided in the plastic sealing layer 26. Conductive bumps 211 are provided on both the top and bottom of the multilayered metal wiring layer 21. The silicon wafer 25 is connected to the conductive bumps 211 on one side of the multilayered metal wiring layer 21. A plastic sealing layer II 26 of the high-density connection layer 2 is fixed to the substrate intermediate 11 by the bonding layer 20 so that the high-density connection layer 2 is embedded in the substrate 1. The conductive bumps 211 on the other side of the multilayered metal wiring layer 21 are electrically connected to the first type bumps 31 of the chip 3 via the first type pads 104. The second type bump 32 of the chip 3 is electrically connected to the second type pad 105 of the substrate 1. The second pad 105 is provided through the surface dielectric layer 103. The BGA package includes filling with filler 41 between the bottom of the chip 3 and the substrate 1, mounting passive components 42 as required, coating the surface of the chip 3 with a thermally conductive interfacial layer 43 to which a heat sink 44 is affixed, the heat sink 44 being connected to the surface of the substrate 1 by bonding material 45, and making the solder balls 46 on the wiring layer 102 at the side of the substrate 1 not packaging the chip 3.

Figure 6:
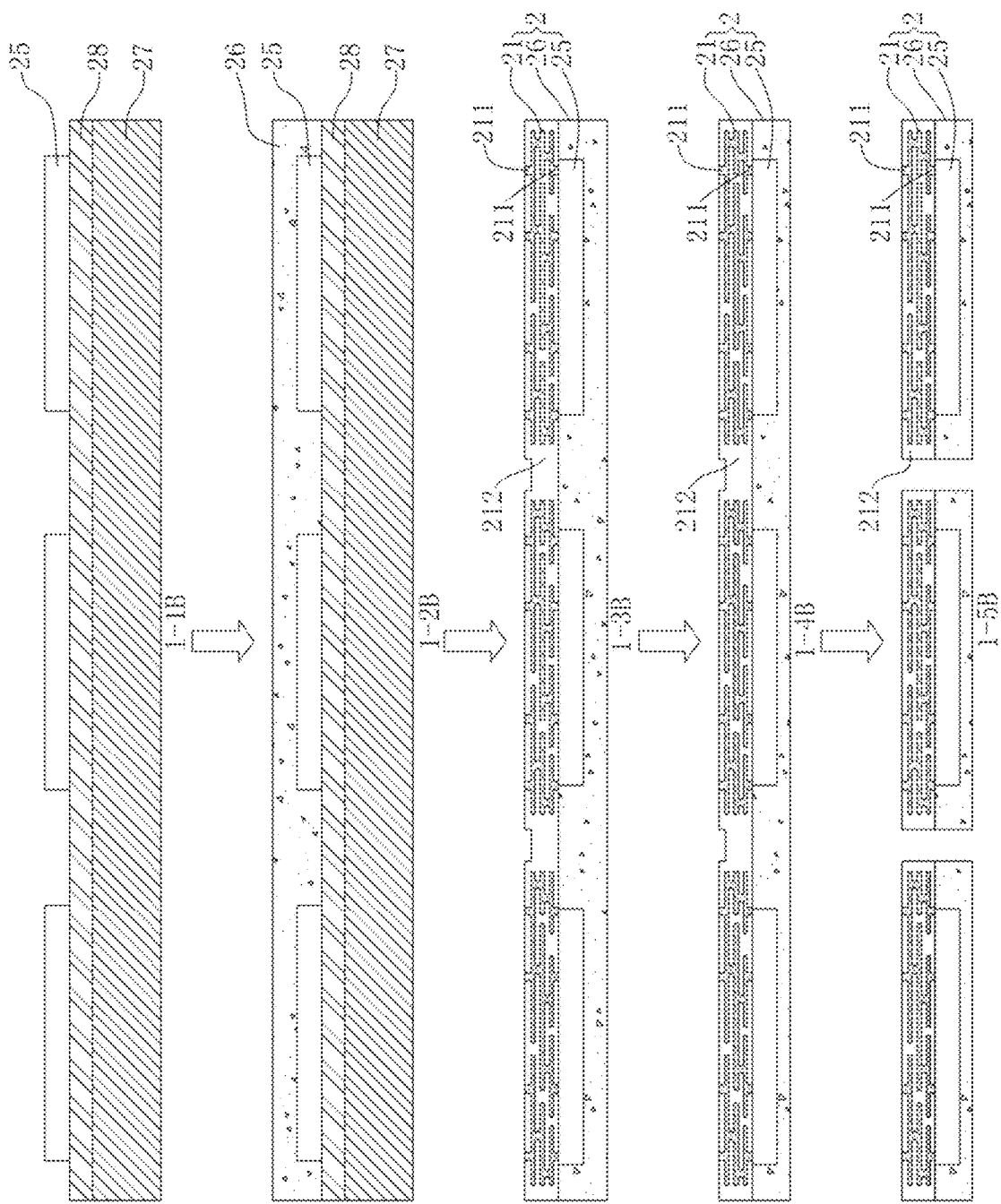
FIG. 6 is a schematic structure diagram showing a process of preparing the high-density connection layer according to the first embodiment of the present disclosure.

The chip package structure utilizes a method for chip packaging including the following steps:

S1: Preparation of high-density connection layer 2, as shown in FIG. 6.

S1-1B: Inversely mounting wafer 25. As shown in 1-1B, a silicon wafer 25 is prepared by grinding and thinning treatment. The wafer 25 is cut from a wafer, which does not contain any device but only serves as a support. A carrier wafer 27 is prepared, on top of which a temporary bonding layer 28 is attached. The wafer 25 is grinded and thinned to form a grinded surface and a glossy surface, where the glossy surface is inverted and pressed onto the temporary bonding layer 28. After the silicon wafer is grinded and thinned so that the thickness becomes 50~100 µm. The thickness of the entire high-density connection layer 2 is 80~200 µm.

S1-2B: Preparation of a plastic sealing layer II 26 for packaging the wafer 25. The carrier wafer 27 with the temporary bonding layer 28 formed in step S1-1B is plastic sealed using injection molding to form a plastic sealing layer II 26, and the wafer 25 is packaged around its interior, as shown in 1-2B.

S1-3B: Preparation of multilayered metal wiring layer 21. As shown in 1-3B, an insulating medium layer 212 with patterned openings is first prepared on the glossy surface of wafer 25 by unbonding the stripped carrier wafer 27 and the temporary bonding layer 28. The material of the insulating medium layer 212 is selected from one of the materials of PI, PBO, BCB, and the multilayered metal wiring layer 21 is formed within the openings by plating or sputtering. Interconnections between the adjacent metal Interconnections are formed between adjacent metal wiring layers. The upper and lower surfaces of the multilayered metal wiring layer 21 have conductive bumps 211. The multilayered metal wiring layer 21 contains 2 to 10 metal wiring layers, which can use copper, aluminum, or other metallic materials as the conductive material.

S1-4B: Thinning of the sealing layer II 26. As shown in 1-4B, in order to reduce the overall thickness, the plastic sealing layer II 26 is thinned by grinding. Since the plastic sealing layer II 26 can play a role of increasing the mechanical strength, the plastic sealing layer II 26 still needs to retain a certain thickness. The thickness of the thinned plastic sealing layer II 26 is required to be at least greater than the thickness of the silicon wafer 25.

S1-5B: The structure formed in step S1-4B is diced to obtain a single-sided high-density connection layer 2, as shown in 1-5B. This high density connection layer 2 utilizes the silicon wafer 25 and the plastic sealing layer II 26 to jointly support the multilayered metal wiring layer 21, facilitating the subsequent affixing of the high density connection layer 2 directly onto the substrate 1.

S2: Preparing the substrate intermediate 11 including at least one dielectric layer 101 and a wiring layer 102 running through the dielectric layer 101. The fabricated high-density connection layer 2 is mounted on the substrate intermediate 11. Specifically a plastic sealing layer II 26 can be fixed to the substrate intermediate 11 by means of a bonding layer 20.

S3: Continue fabrication of the substrate 1 by preparing the surface dielectric layer 103 on the substrate intermediate 11 so that the high-density connection layer 2 is embedded in the surface dielectric layer 103 of the substrate 1. A first type pad 104 and a second type pad 105 are prepared on the surface dielectric layer 103. The bottom of the first type pad 104 is electrically connected to the conductive bumps 211 of the multilayered metal wiring layer 21, the top of which is exposed to the surface dielectric layer 103. The second type pad 105 extends through the surface dielectric layer 103 and the bottom of the second type pad 105 is electrically connected to the wiring layer 102 of the substrate intermediate 11.

S4: The chip 3 is inversely mounted onto the surface of the substrate 1. The chip 3 has a first type bump 31 and a second type bump 32. The first type bump 31 connects the chip 3 to the conductive bumps 211 of the multilayered metal wiring layer 21 via the first type pad 104. The second type bump 32 is electrically connected to the second type pad 105. BGA package is then completed following the inversely mounting of the chip 3 onto the substrate 1. Specifically, filler 41 is filled between the bottom of the chip 3 and the substrate 1, and passive components 42 may be mounted as needed. The surface of the chip 3 is coated with a thermally conductive interface layer 43, on which is mounted a heat sink 44. The heat sink 44 is connected to the surface of the substrate 1 by a bonding material 45. Solder balls 46 are made on the wiring layer 102 at the side of the substrate 1 where the chip 3 is not packaged to complete the ball grid array package.

Third Embodiment

Figure 9:
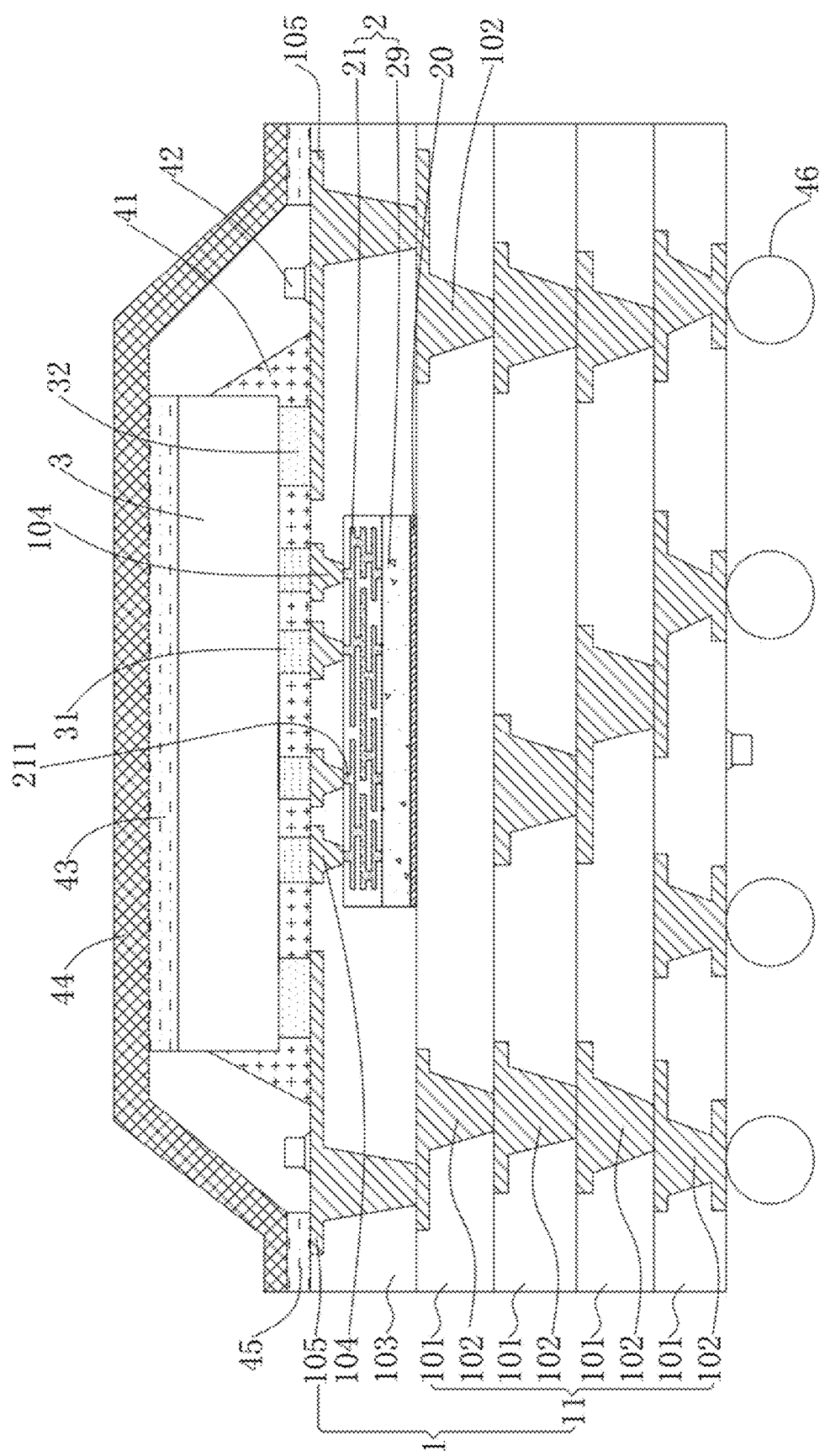
FIG. 9 is a diagram of the chip package structure according to the third embodiment of the present disclosure.

FIG. 9 shows a chip package structure manufactured by the method for chip packaging with a high-density connection layer provided in this embodiment. The chip package structure includes a substrate 1, a high-density connection layer 2 embedded in the substrate 1, and a flip chip 3 on the surface of the substrate 1 and subjected to a BGA package (Ball Grid Array Package). The chip 3 has a first type bump 31 and a second type bump 32. The substrate 1 has a surface dielectric layer 103 in which the high-density connection layer 2 is located, and the substrate under the surface dielectric layer 103 includes at least one layer of a dielectric layer 101 and a wiring layer 102 running through the dielectric layer 101. The high-density connection layer 2 is a single-side high-density connection layer 2, i.e., having electrical connection only on one side with other devices. The high-density connection layer 2 includes multilayered metal wiring layer 21 and a plastic sealing layer three 29 located on one side of the multilayered metal wiring layer 21. The surface of the multilayered metal wiring layer 21 is provided with electrically conductive bumps 211. A plastic sealing layer III 29 of the high-density connection layer 2 is secured to the substrate intermediate 11 through the bonding layer 20 to enable the high-density connection layer 2 to embed in the substrate 1. The electrically conductive bumps 211 of the multilayered metal wiring layer 21 are electrically connected to the first type bumps 31 of the chip 3 via the first type pads 104. The second type bump 32 of the chip 3 is electrically connected to the second type pad 105 of the substrate 1. The second type pad 105 is provided through the surface dielectric layer 103. The BGA packaging includes filling fillers 41 between the bottom of the chip 3 and the substrate 1, mounting passive components 42 as required, coating the surface of the chip 3 with a thermally conductive interface layer 43 to which a heat sink 44 is attached, the heat sink 44 being connected to the surface of the substrate 1 by a bonding material 45, and making solder balls 46 on the wiring layer 102 at the side of the substrate 1 without the packaged chip.

Figure 8:
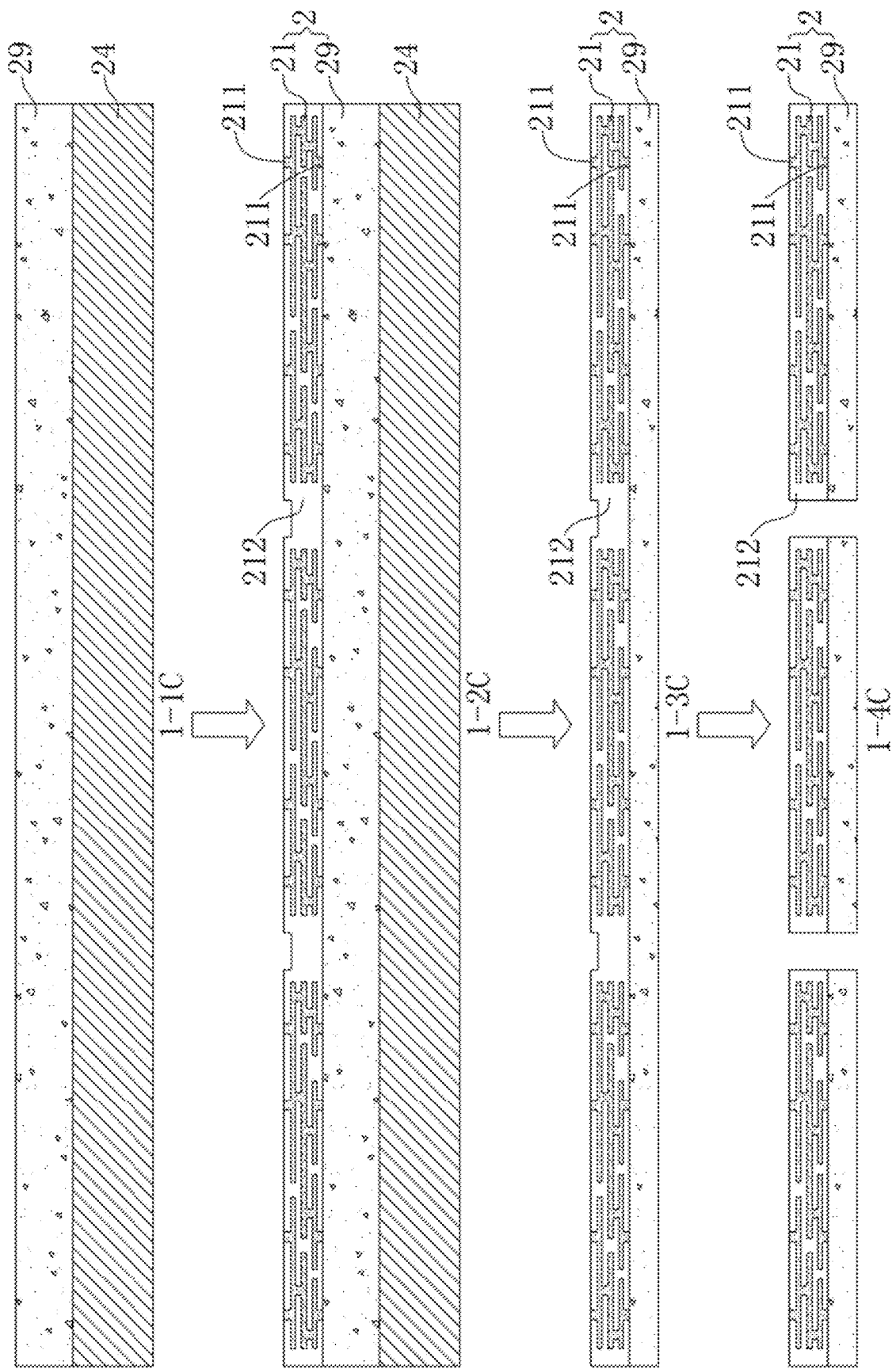
FIG. 8 is a schematic structure diagram showing a process of preparing the high-density connection layer according to the third embodiment of the present disclosure.

The chip package structure utilizes a method for chip packaging including the following steps:

S1: Preparation of high-density connection layer 2, as shown in FIG. 8.

S1-1C: Preparation of plastic sealing layer III 29 on substrate 24. As shown in 1-1C, a substrate 24 made of one of silicon, ceramic, or glass is prepared for providing support function. A plastic sealing layer III 29 is made on the substrate 24 by injection molding epoxy resin molding plastic or laminating ABF material.

S1-2C: Preparation of the multilayered metal wiring layer 21. An insulating medium layer 212 with patterned openings is prepared on the surface of the plastic sealing layer III 29, as shown in 1-2C. The insulating medium layer 212 is made of one of PI, PBO, or BCB. Multilayered metal wiring layer 21 is formed within the openings using an electroplating or sputtering process. Multilayered metal wiring layer 21 has conductive bumps 211 on its surface and interconnections between adjacent metal wiring layers. The multilayered metal wiring layer 21 has 2 to 10 metal wiring layers, which can use copper, aluminum, or other metallic materials as the conductive material.

S1-3C: Thinning the plastic sealing layer three 29. As shown in 1-3C, after removing the substrate 24, the plastic sealing layer III 29 is grinded to reduce the overall thickness. However, the plastic sealing layer III 29 still needs to retain a certain thickness because of the subsequent need to rely on the plastic sealing layer III 29 for support. In this embodiment, the thickness of the multilayered metal wiring layer 21 is 30 to 70 μm, and the thickness of the plastic sealing layer three 29 is controlled to control the overall thickness of the high-density connection layer 2 at 50 to 200 μm.

S1-4C: The structure formed in steps S1-3C is cut into single pieces to obtain a single-sided high-density connection layer 2, as shown in 1-4C.

S2: Preparation of the substrate intermediate 11 including at least one dielectric layer 101 and a wiring layer 102 running through the dielectric layer 101. The fabricated high-density connection layer 2 is mounted on the substrate intermediate 11, e.g., the plastic sealing layer III 29 is fixed to the substrate intermediate 11 by means of a bonding layer 20.

S3: Continue to complete the fabrication of the substrate 1. A surface dielectric layer 103 is prepared on the substrate intermediate 11 so that the high-density connection layer 2 is embedded in the surface dielectric layer 103 of the substrate 1. A first type pad 104 and a second type pad 105 are prepared on the surface dielectric layer 103. The first type pad 104 is electrically connected at its bottom to the conductive bumps 211 of the multilayered metal wiring layer 21, with its top exposed to the surface dielectric layer 103. The second type pad 105 runs through the surface dielectric layer 103, and is electrically connected at its bottom to the wiring layer 102 of the substrate intermediate 11.

S4: Inversely mounting the chip 3 onto the surface of the substrate 1. The chip 3 has a first type bump 31 and a second type bump 32. The first type bump 31 connects the chip 3 to the conductive bumps 211 of the multilayered metal wiring layer 21 via the first type pad 104, and the second type bump 32 is electrically connected to the second type pad 105. After the chip 3 is inversely mounted onto the substrate 1, continues BGA packaging, which includes filling with filler 41 between the bottom of the chip 3 and the substrate 1, mounting passive components 42 as needed, coating the surface of the chip 3 with a thermally conductive interface layer 43, mounting a heat sink 44 on the thermally conductive interface layer 43, the heat sink 44 being connected to the surface of the substrate 1 by a bonding material 45, and making solder balls 46 on the wiring layer 102 at the side of the substrate 1 without packaged chip 3 to complete the ball grid array package.

Fourth Embodiment

The main difference between the fourth embodiment and the first embodiment is that a single chip 3 is inversely mounted on the surface of the substrate 1.

Figure 10:
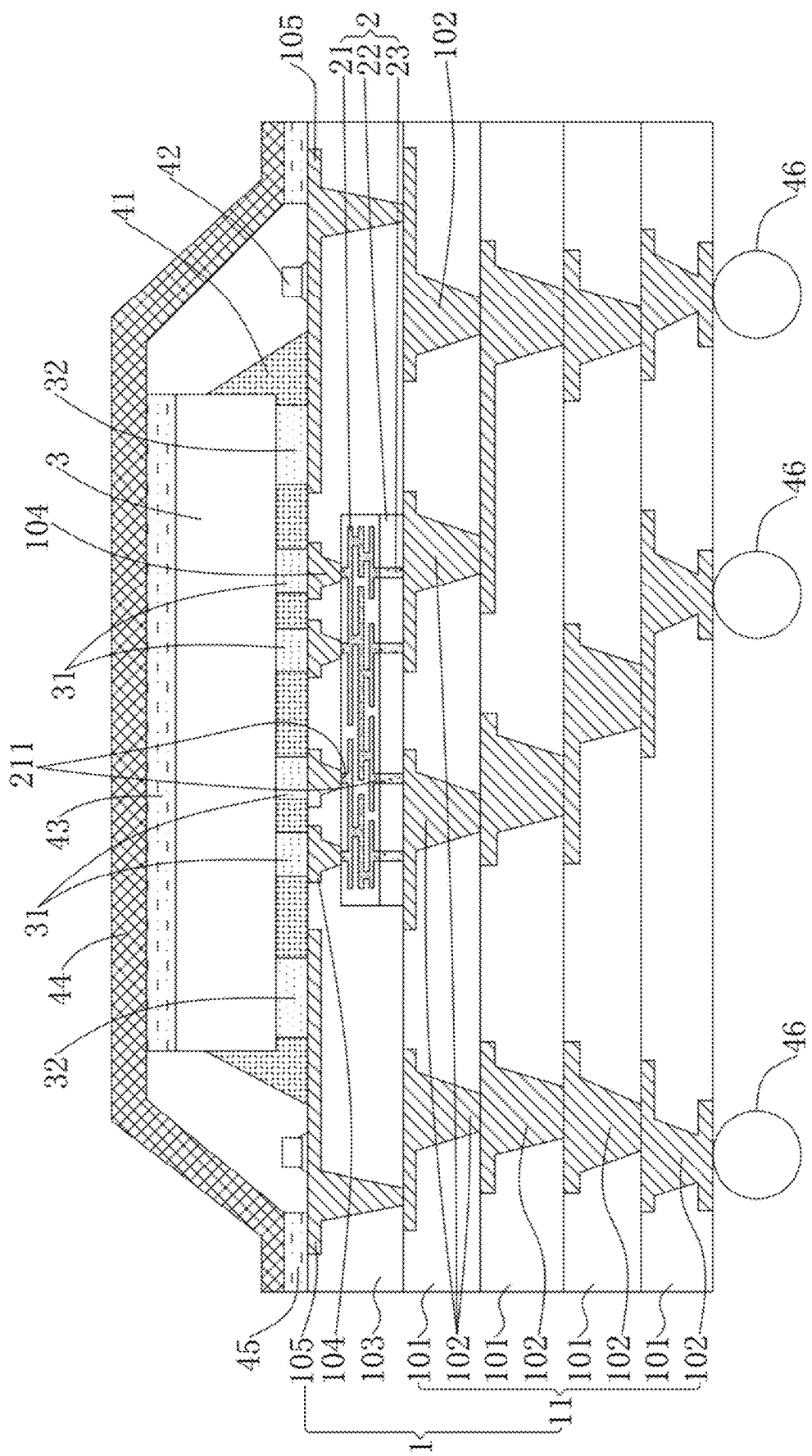
FIG. 10 is a diagram of the chip package structure according to the fourth embodiment of the present disclosure.

FIG. 10 shows a chip package structure manufactured by the method for chip packaging with a high-density connection layer provided in this embodiment. The chip package structure includes a substrate 1, a high-density connection layer 2 embedded in the substrate 1, and a flip chip 3 on the surface of the substrate 1. The high-density connection layer 2 is a double-sided high-density connection layer 2, and the manufacturing process thereof is the same as that of the high-density connection layer 2 of the first embodiment.

The chip 3 has a first type bump 31 and a second type bump 32. The high-density connection layer 2 is embedded in the substrate 1. Copper posts 23 are electrically connected to the wiring layer 102 of the substrate 1. A conductive bump 211 on the other side of the multilayered metal wiring layer 21 is electrically connected to the first type bump 31 of the chip 3 via the first type pad 104. The second type bump 32 of the chip 3 is electrically connected to the second type pad 105 of the substrate 1. The second type pad 105 is provided through the surface dielectric layer 103. In certain applications, all the bumps of the chip 3 may be first class bumps 31.

The BGA packaging is conducted following the inversely mounting of the chip 3 on the substrate 1, including filling with filler 41 between the bottom of the chip 3 and the substrate 1, and passive components 42 can be mounted as needed, coating the surface of the chip 3 with a thermally-conductive interface layer 43, mounting a heat sink 44 on top of the chip 3, the heat sink 44 being connected to the surface of the substrate 1 by a bonding material 45, and then making solder balls 46 on the wiring layer 102 on the side of the substrate 1 not packaging the chip 3, thus completing the ball grid array package.

The present disclosure provides a method for chip packaging with a high-density connection layer and a chip packaging structure made thereby, wherein a high-density connection layer 2 of a desired structure is first prepared, then the high-density connection layer 2 is affixed to a substrate intermediate 11, continuing fabrication of the substrate 1 so that the high-density connection layer 2 is embedded within the substrate 1, and then inversely mounting the chip 3 on the substrate 1 to complete the packaging. The method for chip packaging utilizes a wafer-level process to interconnect the chip 3 with the substrate 1. The high-density connection layer 2 having multilayered metal wiring layer 21 is embedded in the substrate 1 to replace a portion of the wiring layer 102 inside the substrate, thereby reducing the number of layers of the substrate 1. The high-density connection layer 2 can be pre-fabricated using a micron-level lithography, which makes the process route relatively simple and easy to implement and reduces costs.

The specific structure of the high-density connection layer 2 can be diversified, increasing the design flexibility and reducing the difficulty of laying out the wiring of the substrate 1. The substrate 1 combined with the high-density connection layer 2 can reduce the thickness of the substrate 1, so that the devices can be arranged in a more compact manner, thereby improving the integration and performance of the circuit. The high-density connection layer 2 inside the prepared chip package structure can be single-sided or double-sided. The interconnection between the double-sided high-density connection layer 2 and the substrate 1 is increased compared to the single-sided high-density connection layer 2, and the connection efficiency is higher, which reduces the difficulty of the wiring in the chip package structure.

The above described are only some embodiments of the present disclosure. To a person of ordinary skill in the art, other deformations and improvements may be made without departing from the creative concept of the present disclosure, which are all within the scope of protection of the present disclosure.

The invention claimed is:

1. A method for chip packaging having a high-density connection layer, comprising
- S1: preparing a high-density connection layer comprising a multilayered metal wiring layer and a plastic sealing layer II disposed on one side of the multilayered metal wiring layer, said multilayered metal wiring layer having conductive bumps on upper and lower surfaces of the multilayered metal wiring layer, said plastic sealing layer II having a silicon wafer therein being electrically connected to the conductive bumps on the lower surface of the multilayered metal wiring layer; wherein the preparation of said high-density connection layer comprises:
  - S1-1B: inversely mounting silicon wafers by: preparing silicon wafers being ground and thinned to form a ground surface and a bright surface, said silicon wafers being cut from a wafer and not containing a device; preparing a carrier wafer to which a temporary bonding layer is affixed; and inverting and pressing the bright surface of said silicon wafers onto the temporary bonding layer;
  - S1-2B: preparing a plastic sealing layer II wrapping the silicon wafers by: conducting plastic sealing on the temporary bonding layer by injection molding to form the plastic sealing layer II inside which said silicon wafers are wrapped;
  - S1-3B: preparing a multilayered metal wiring layer by: stripping the temporary bonding layer from the carrier wafer by debonding, firstly preparing an insulating medium layer with patterned openings on the bright surface of the silicon wafers, and forming said multilayered metal wiring layer by electroplating or sputtering process within the openings, said multilayered metal wiring layer having conductive bumps on upper and lower surfaces thereof and interconnections between adjacent metal wiring layers, and the metal wiring layers having 2 to 10 layers;
  - S1-4B: thinning the plastic sealing layer II to a thickness at least greater than the thickness of the silicon wafers;
  - S1-5B: dicing a structure formed in step S1-4B to obtain the high-density connection layer;
- S2: preparing a substrate intermediate comprising at least one dielectric layer and a wiring layer running through the dielectric layer, and attaching the high-density connection layer to the substrate intermediate;
- S3: continuing fabrication of a substrate by preparing a surface dielectric layer on said substrate intermediate, the high-density connection layer being embedded in the surface dielectric layer of the substrate, preparing a first type of pads and a second type of pads on said surface dielectric layer, said first type of pads electrically connected at a bottom thereof to the conductive bumps on the upper surface of the multilayered metal wiring layer and exposed at a top thereof from said surface dielectric layer, said second type of pads running through the surface dielectric layer and electrically connected at a bottom thereof to the substrate intermediate's wiring layer; and
- S4: inversely mounting a chip on a surface of the substrate, said chip being provided with a first type of bumps and a second type of bumps, said first type of bumps being electrically connected to the first type of pads in a one to one manner, and said second type of bumps being electrically connected to the second type of pads in a one to one manner.

2. The method according to claim 1, further comprising continuing packaging the chip after completion of said step S4, filling a filler between a bottom of the chip and the substrate, a surface of said chip being coated with a thermally conductive interface layer, a surface of said thermally conductive interface layer being affixed with a heat sink, a surface of said heat sink and the surface of the substrate being connected by a bonding material, and making solder balls on the wiring layer at a side of said substrate in which the chip is not encapsulated to complete a ball grid array package.

3. The method according to claim 1, wherein in said step S4, there are at least two chips inversely mounted on the surface of the substrate, the first type of bumps of two adjacent chips among the at least two chips being positioned close to each other and are both connected to the conductive bumps of the multilayered metal wiring layer, so that the two adjacent chips are connected by the high-density connection layer.

4. The method according to claim 3, wherein the first type of bumps have a diameter of 25 to 65 μm and a center spacing dimension of 40 to 100 μm between adjacent first type of bumps, and the second type of bumps have a diameter dimension of 60 to 150 μm and a center spacing dimension of 100 to 300 μm between adjacent second type of bumps.

5. A chip package structure having a high-density connection layer, prepared by the chip package method according to claim 2, said chip package structure comprising a substrate, a high-density connection layer embedded in the substrate, a chip inversely mounted on a surface of the substrate, said substrate having a surface dielectric layer, said high-density connection layer disposed in said surface dielectric layer, said surface dielectric layer being provided with a first type of pads and a second type of pads, said substrate below said surface dielectric layer comprising at least one dielectric layer and a wiring layer running through the dielectric layer, said high-density connection layer comprising a multilayered metal wiring layer and a plastic sealing layer II disposed on one side of the multilayered metal wiring layer, said plastic sealing layer II being provided inside with a silicon wafer, upper and lower surfaces of said multilayered metal wiring layer are provided with conductive bumps, said silicon wafer being connected with the conductive bumps on the lower surface of the multilayered metal wiring layer, said chip being provided with a first type of bumps and a second type of bumps, the conductive bumps on the upper surface of the multilayered metal wiring layer being electrically connected to the first type of bumps through the first type of pads, and the second type of bumps are electrically connected to the second type of pads, a filler being filled between a bottom of the chip and the substrate, a surface of the chip being coated with a thermally conductive interface on which a heat sink is affixed, a surface of the heat sink being attached to the substrate with bonding material, and solder balls being formed on the wiring layer at a side of the substrate without the encapsulated chip.

* * * * *